(12) United States Patent
Kawamura

(10) Patent No.: US 11,548,663 B2
(45) Date of Patent: Jan. 10, 2023

(54) CABLE WRAP MECHANISM

(71) Applicant: Mitsubishi Electric Corporation, Chiyoda-ku (JP)

(72) Inventor: Shunichi Kawamura, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 957 days.

(21) Appl. No.: 16/332,857

(22) PCT Filed: Dec. 29, 2016

(86) PCT No.: PCT/JP2016/089213
§ 371 (c)(1),
(2) Date: Mar. 13, 2019

(87) PCT Pub. No.: WO2018/061230
PCT Pub. Date: Apr. 5, 2018

(65) Prior Publication Data
US 2019/0359356 A1 Nov. 28, 2019

(30) Foreign Application Priority Data

Sep. 29, 2016 (JP) .............................. JP2016-190587

(51) Int. Cl.
*H02G 11/02* (2006.01)
*B64G 1/42* (2006.01)
*H01B 7/08* (2006.01)

(52) U.S. Cl.
CPC ............. *B64G 1/428* (2013.01); *H02G 11/02* (2013.01); *H01B 7/0892* (2013.01)

(58) Field of Classification Search
CPC ....... B64G 1/428; H02G 11/02; H01B 7/0892
(Continued)

(56) References Cited

U.S. PATENT DOCUMENTS 3,634,782 A * 1/1972 Marshall .............. H01B 7/0861
174/117 F
3,657,491 A * 4/1972 Ryder .................... H02G 11/02
242/378
(Continued)

FOREIGN PATENT DOCUMENTS

EP 2 620 371 A1 7/2013
GB 869275 5/1961
(Continued)

OTHER PUBLICATIONS

Communication Pursuant to Article 94(3) EPC dated Jun. 4, 2020 in corresponding European application No. 16917778.9, 6 pages.
(Continued)

*Primary Examiner* — Timothy J Thompson
*Assistant Examiner* — Michael F Mcallister
(74) *Attorney, Agent, or Firm* — Oblon, McClelland, Maier & Neustadt, L.L.P.

(57) ABSTRACT

A cable (130) includes an electrical wire band (134). A parallel electrical wire (133) is formed by arranging a pair of a first electrical wire (131) and a second electrical wire (132) without being twisted together. The electrical wire band is formed by arranging a plurality of parallel electrical wires in a lateral row. In addition, between two adjacent parallel electrical wires, a second electrical wire of one parallel electrical wire is arranged adjacently to a first electrical wire of the other parallel electrical wire. Further, the electrical wire band is wound and accommodated in a spiral spring shape in a cable wrap mechanism (100).

7 Claims, 3 Drawing Sheets

(58) Field of Classification Search
USPC .......... 191/12.2 R; 174/117 F, 36; 333/1, 12, 333/243
See application file for complete search history.

(56) References Cited

U.S. PATENT DOCUMENTS

| | | | | |
|---|---|---|---|---|
| 3,763,306 A * | 10/1973 | Marshall | ................ | H01B 11/00 |
| | | | | 174/120 SR |
| 4,154,977 A * | 5/1979 | Verma | ................ | H01B 7/0846 |
| | | | | 439/502 |
| 4,185,162 A | 1/1980 | Bogese, II | | |
| 4,610,908 A * | 9/1986 | Reylek | ................ | H05K 3/323 |
| | | | | 428/323 |
| 4,930,716 A * | 6/1990 | Bannai | ................ | H01R 35/025 |
| | | | | 439/15 |
| 5,082,451 A * | 1/1992 | Bannai | ................ | B60R 16/027 |
| | | | | 439/15 |
| 5,149,273 A * | 9/1992 | Bannai | ................ | H01R 35/025 |
| | | | | 439/15 |
| 5,245,134 A * | 9/1993 | Vana, Jr. | ................ | H01B 11/203 |
| | | | | 385/112 |
| 5,468,159 A * | 11/1995 | Brodsky | ................ | H01B 7/0846 |
| | | | | 439/501 |
| 5,590,749 A * | 1/1997 | Wagner | ................ | H02G 11/02 |
| | | | | 379/438 |
| 5,655,726 A * | 8/1997 | Peterson | ................ | H04M 1/15 |
| | | | | 242/378.2 |
| 5,665,940 A * | 9/1997 | Chimura | ................ | H01B 7/0838 |
| | | | | 174/117 F |
| 5,819,893 A * | 10/1998 | Wagner | ................ | H02G 11/02 |
| | | | | 379/438 |
| 5,890,921 A * | 4/1999 | Kuroda | ................ | H01R 35/025 |
| | | | | 439/15 |
| 6,253,893 B1 | 7/2001 | Chi-Min | | |
| 6,328,243 B1 * | 12/2001 | Yamamoto | ................ | H02G 11/02 |
| | | | | 242/378.1 |
| 6,469,252 B1 * | 10/2002 | Tanaka | ................ | B60R 16/027 |
| | | | | 174/117 F |
| 6,565,043 B1 | 5/2003 | Wittmann | | |
| 7,172,150 B1 * | 2/2007 | Hutchison, II | ......... | B65H 75/48 |
| | | | | 242/378.2 |
| 10,079,082 B2 * | 9/2018 | Chen | ................ | H01B 7/0009 |
| 10,230,200 B1 * | 3/2019 | Tomasko | ................ | B65H 75/4471 |
| 2002/0040945 A1 * | 4/2002 | Stepancich | ........ | B65H 75/4431 |
| | | | | 242/378.1 |
| 2002/0170729 A1 | 11/2002 | Murakami et al. | | |
| 2005/0098405 A1 * | 5/2005 | Chang | ................ | B65H 75/4431 |
| | | | | 191/12.2 R |
| 2008/0254646 A1 * | 10/2008 | Reischl | ................ | H01R 35/025 |
| | | | | 439/15 |
| 2009/0200722 A1 * | 8/2009 | Nakano | ................ | B25J 19/0029 |
| | | | | 269/61 |
| 2010/0214761 A1 | 8/2010 | Matsukawa et al. | | |
| 2011/0267798 A1 * | 11/2011 | Nakazaki | ............ | H04M 1/0225 |
| | | | | 361/827 |

FOREIGN PATENT DOCUMENTS

| | | |
|---|---|---|
| JP | 1-119114 U | 8/1989 |
| JP | 8-77839 A | 3/1996 |
| JP | 2002-343156 A | 11/2002 |
| JP | 5155589 B2 | 3/2013 |
| JP | 5222944 B2 | 6/2013 |
| WO | WO 2009/063919 A1 | 5/2009 |

OTHER PUBLICATIONS

International Search Report dated Mar. 7, 2017 in PCT/JP2016/089213 filed on Dec. 29, 2016.
Extended European Search Report dated Aug. 19, 2019 in corresponding European Patent Application No. 16917778.9, 7 pages.
European Office Action dated Feb. 7, 2022 in European Patent Application No. 16917778.9, 5 pages.

* cited by examiner

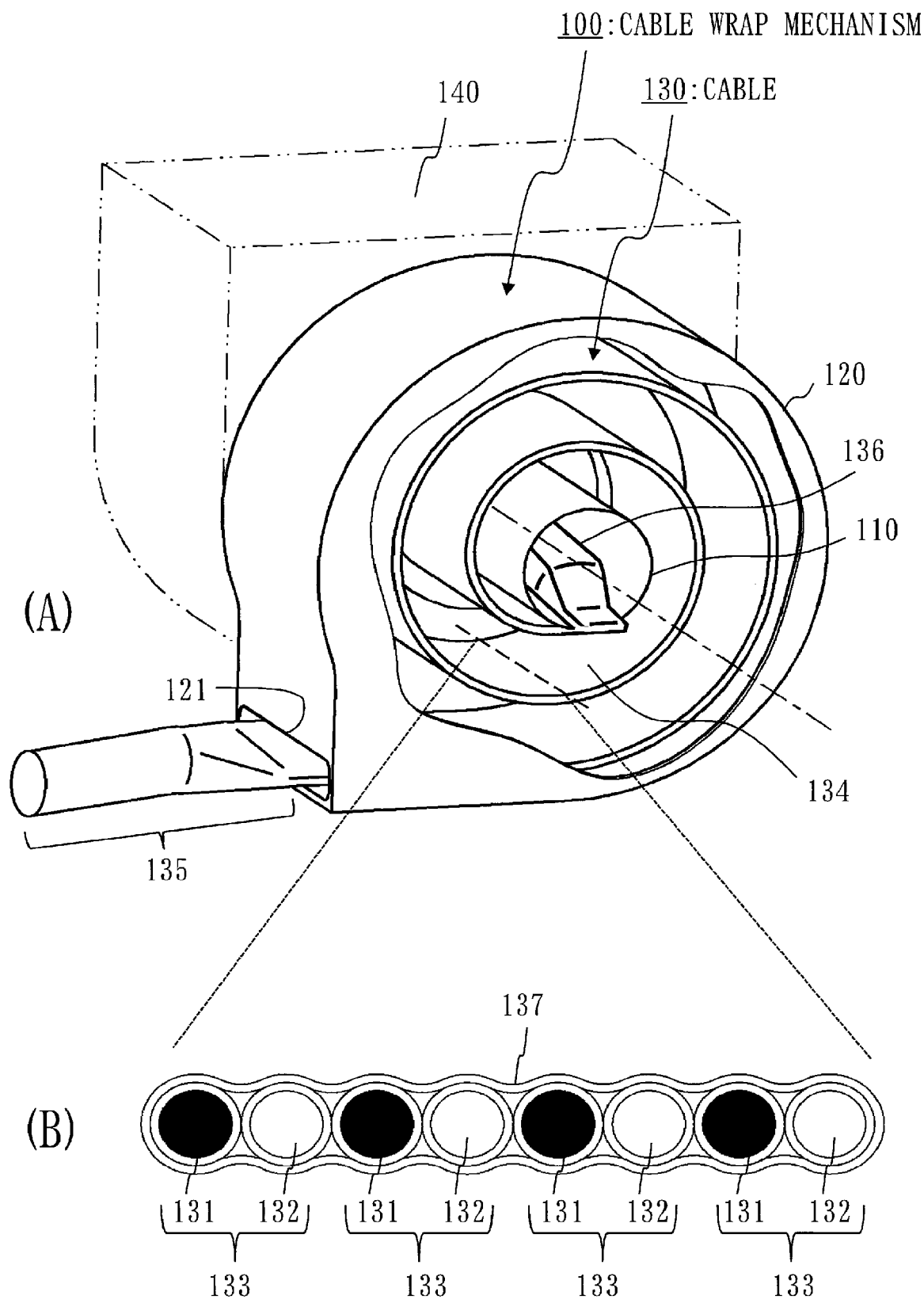

CABLE WRAP MECHANISM

TECHNICAL FIELD

The present invention relates to a mechanism that accommodates a part of a cable used for electrical equipment of an artificial satellite.

BACKGROUND ART

Since a large current is required to flow in an electric propulsion thruster mounted on an artificial satellite, the number of electrical wires required for the electric propulsion thruster is large.

In addition, in order to adjust an arrangement of the electric propulsion thruster, it is necessary to pass a large number of electrical wires through a movable portion of a mechanism that adjusts the arrangement of the electric propulsion thruster.

Further, when resistance force against bending in an electrical wire is large, it is necessary to strengthen a power source such as a motor used for an adjustment mechanism. Therefore, implementation to minimize the resistance force is required.

Further, since an electromagnetic induction noise is generated from an electrical wire when the large current flows through the electrical wire, implementation to minimize the electromagnetic induction noise generated from the electrical wire is required.

Patent Literature 1 discloses an artificial satellite mounted with an electric propulsion thruster that is arranged by a deployment boom.

CITATION LIST

Patent Literature

Patent Literature 1: U.S. Pat. No. 6,565,043

SUMMARY OF INVENTION

Technical Problem

An object of the present invention is to reduce resistance force against bending in an electrical wire and an electromagnetic induction noise generated from the electrical wire, and the electrical wire can be easily wound into a spiral spring shape.

Solution to Problem

A cable wrap mechanism according to the present invention is a mechanism in which a part of a cable is wound and accommodated in a spiral spring shape, The cable includes an electrical wire band.

The electrical wire band includes a plurality of parallel electrical wires in which a first electrical wire and a second electrical wire which forms a pair with the first electrical wire are arranged without being twisted together. The plurality of parallel electrical wires are arranged in a lateral row, and a second electrical wire of one parallel electrical wire of adjacent parallel electrical wires and a first electrical wire of the other parallel electrical wire of the adjacent parallel electrical wires are arranged to be adjacent to each other.

The electrical wire band is wound and accommodated in a spiral spring shape as a part of the cable.

Advantageous Effects of Invention

According to the present invention, resistance force against bending in the electrical wire band and an electromagnetic induction noise generated from the electrical wire band are reduced, and the electrical wire band can be easily wound into a spiral spring shape.

As a result, a large number of electrical wires are able to pass through a movable portion of a mechanism that adjusts the arrangement of an electrical propulsion thruster.

BRIEF DESCRIPTION OF DRAWINGS

FIG. 3 is a configuration diagram of a cable wrap mechanism 100 in an embodiment 2.

DESCRIPTION OF EMBODIMENTS

Figure 1:
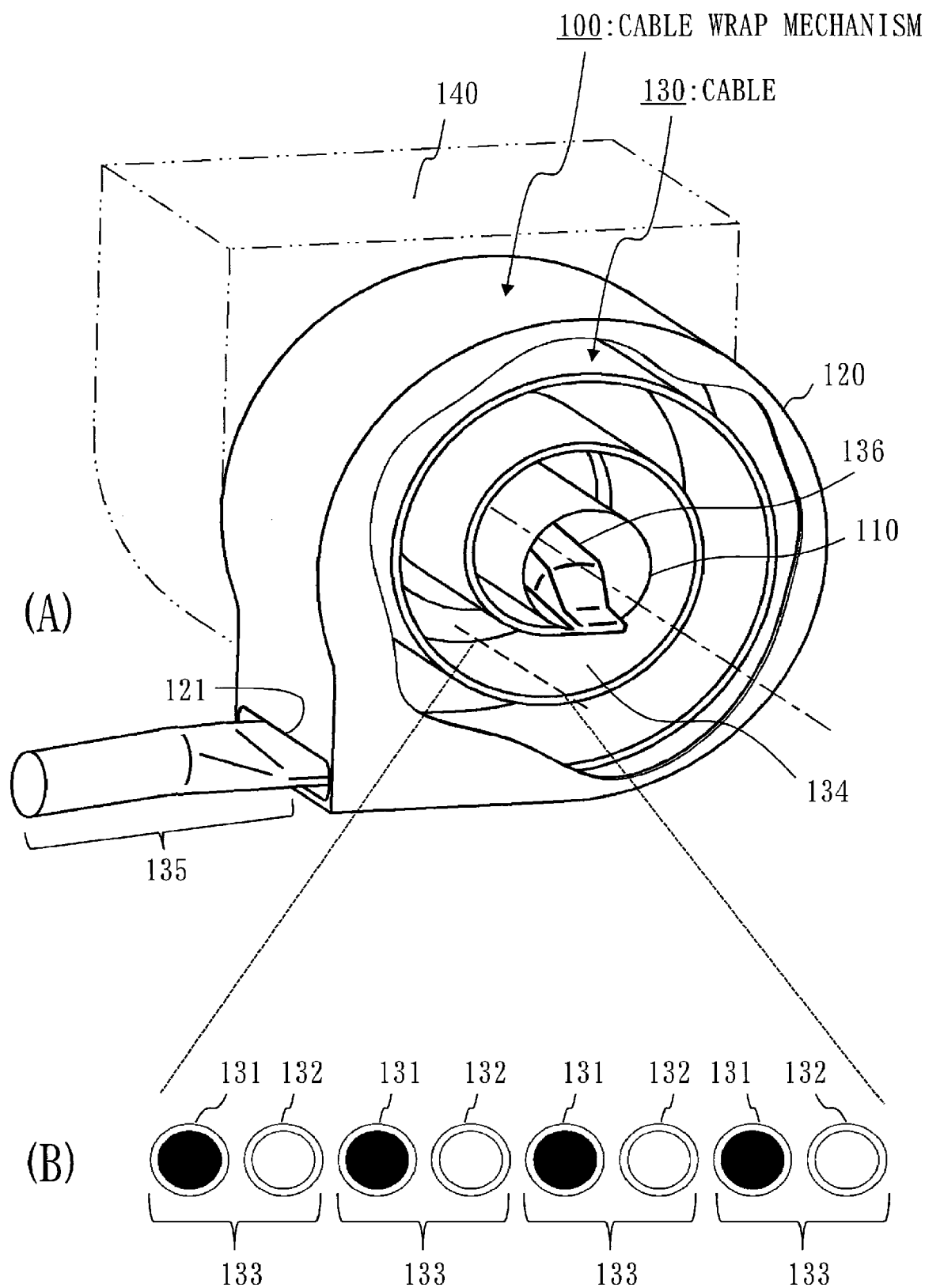
FIG. 1 is a configuration diagram of a cable wrap mechanism 100 in an embodiment 1.

In the embodiments and the drawings, same elements or mutually corresponding elements are attached with the same reference numerals. The description of the elements attached with the same reference numerals will be omitted or simplified appropriately.

Embodiment 1

A cable wrap mechanism in which a part of a cable is wound and accommodated in a spiral spring shape will be described with reference to FIGS. 1 and 2.

Description of Structures

Structures of a cable wrap mechanism 100 and a cable 130 will be described with reference to FIG. 1.

Figure 2:
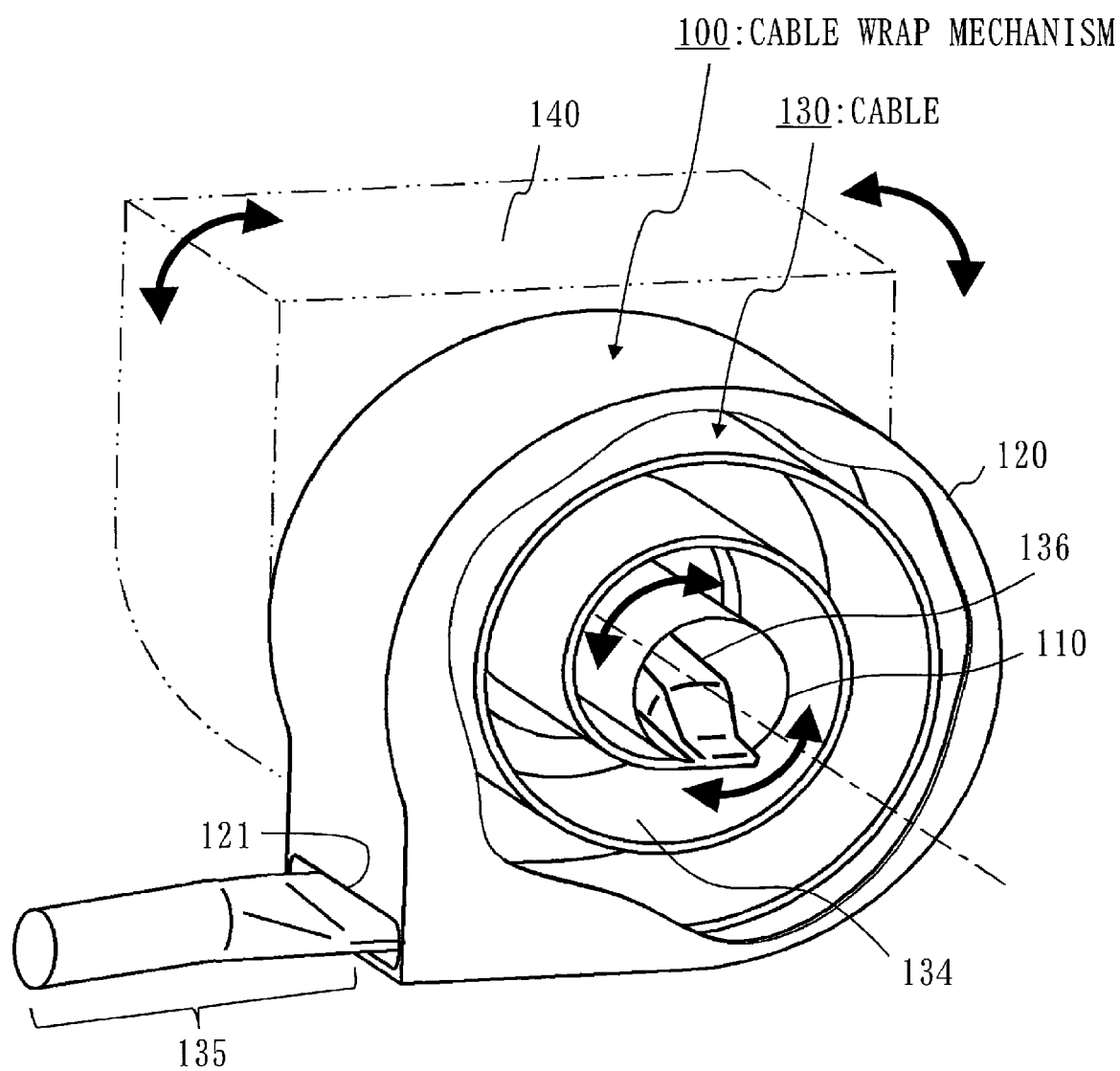
FIG. 2 is a diagram illustrating operation of the cable wrap mechanism 100 and a cable 130 in the embodiment 1.

(A) of FIG. 1 is a perspective view illustrating the interior of the cable wrap mechanism 100. (B) of FIG. 1 is an enlarged cross-sectional view of the cable 130 in a portion indicated by broken lines illustrated in (A) of FIG. 1.

In the embodiment 1, the cable wrap mechanism 100 and the cable 130 are components used for an artificial satellite.

Specifically, the cable wrap mechanism 100 is connected to a movable portion 140 of a thruster pointing mechanism. The thruster pointing mechanism adjusts an arrangement of a thruster. The movable portion 140 is a bracket that supports the thruster pointing mechanism and can be rotated. A dashed line with one dot passing through a shaft 110 represents a rotation axis.

Specifically, the cable 130 is used as a wiring of the thruster.

Unless otherwise specified, the thruster means an electric propulsion thruster.

In the cable wrap mechanism 100, an electrical wire band 134 which is a part of the cable 130 is wound and accommodated in a spiral spring shape. The spiral spring shape is also referred to as a spiral shape.

In (A) of FIG. 1, the electrical wire band 134 wound a plurality of times is accommodated in the cable wrap mechanism 100. Specifically, the electrical wire band 134 wound two times is accommodated in a chassis 120.

The cable 130 includes the electrical wire band 134.

The electrical wire band 134 has a length that allows routing the electrical wire band 134 around the shaft 110 a plurality of times.

The electrical wire band 134 includes a plurality of parallel electrical wires 133 that are arranged in a lateral row. In (B) of FIG. 1, four parallel electrical wires 133 are arranged in a lateral row to form the electrical wire band 134.

The parallel electrical wire 133 is formed by arranging a first electrical wire 131 and a second electrical wire 132 without being twisted together. That is, the parallel electrical wire 133 is not a twisted wire in which two electrical wires are twisted together. Further, the parallel electrical wire 133 is not a shielded wire to which a shield is applied either.

The first electrical wire 131 and the second electrical wire 132 form a pair of electrical wires. Specifically, the first electrical wire 131 is a hot wire (HOT wire), and the second electrical wire 132 is a return wire (RETURN wire). The hot wire is a positive electrical wire. The return wire is a negative electrical wire.

In each of the electrical wires, a rod-shaped conductor is covered with a cover.

In adjacent parallel electrical wires 133, a second electrical wire 132 of one parallel electrical wire 133 is arranged adjacently to a first electrical wire 131 of the other parallel electrical wire 133.

That is, the first electrical wires 131 and the second electrical wires 132 are alternately arranged in the electrical wire band 134.

The cable 130 further includes two electrical wire bundles (135 and 136) connected to end portions of the electrical wire band 134 in a length direction.

Each of the electrical wire bundles is formed by bundling a plurality of parallel electrical wires 133. Specifically, the first electrical wire 131 and the second electrical wire 132 of each parallel electrical wire 133 are twisted together to form a twisted wire, and a plurality of twisted wires are bundled to form the electrical wire bundle.

The cable wrap mechanism 100 includes the shaft 110 and the chassis 120.

The shaft 110 is a tubular component.

The shaft 110 is provided inside the chassis 120. Specifically, the shaft 110 is provided at a central portion of the chassis 120. In addition, the shaft 110 is connected to the movable portion 140.

One end portion of the electrical wire band 134 in the length direction is fixed to an outer surface, having the cylindrical shape, of the shaft 110. Further, an electrical wire bundle 136 connected to the one end portion of the electrical wire band 134 is inserted into the shaft 110.

The chassis 120 is a component that accommodates the electrical wire band 134.

The chassis 120 has a cavity therein, and an inner wall surface covering the cavity is formed in a cylindrical shape. In addition, an accommodation port 121, which forms a rectangular through hole, is formed in a part of a wall surface of the chassis 120, and the accommodation port 121 communicates the internal cavity with an external space. The electrical wire band 134 protrudes from an internal space of the chassis 120 to the external space via the accommodation port 121. The shaft 110 is arranged such that a cylindrical axis of the outer surface, having the cylindrical shape, of the shaft 110 is coaxial with a cylindrical axis of an inner wall surface, having cylindrical shape, of the chassis 120.

The electrical wire band 134 is wound into a spiral spring shape and accommodated in the chassis 120.

As illustrated in (A) of FIG. 1, the electrical wire band 134 is wound into a spiral spring shape along the inner wall surface, having the cylindrical shape, of the chassis 120. Here, the electrical wire band 134 may be wound into a spiral spring shape and disposed between the shaft 110 and the chassis 120 so that the direction of a straight line, which connects a normal line to a certain tangent plane to the inner wall surface, having the cylindrical shape, of the chassis 120 with a normal line to a certain tangent plane to the outer surface, having the cylindrical shape, of the shaft 110, is the direction of a normal line to a certain tangent plane to a flat surface in the electrical wire band 134.

Accordingly, when the shaft 110 rotates relative to the chassis 120, it is possible to reduce resistance force (torque) due to bending force of the electrical wire band 134, or resistance force (torque) due to friction force accompanying contact of the electrical wire band 134.

The chassis 120 is fixed so as not to be rotated. For example, the chassis 120 is fixed to a body of the artificial satellite. Specifically, the body of the artificial satellite is a structure of the artificial satellite.

In the interior of the chassis 120, the other end portion of the electrical wire band 134 in the length direction is fixed in the vicinity of the accommodation port 121. Further, an electrical wire bundle 135 connected to the other end portion is disposed outside the chassis 120.

The accommodation port 121 is a hole provided in the chassis 120 to put the plurality of parallel electrical wires 133 in or out of the chassis 120.

Description of Operation

Operation of the cable wrap mechanism 100 and the cable 130 will be described with reference to FIG. 2.

Arc shaped arrows indicate rotation directions of the movable portion 140 and the shaft 110.

Since the shaft 110 is connected to the movable portion 140, the shaft 110 rotates together with the movable portion 140 when the movable portion 140 rotates.

The one end portion of the electrical wire band 134 is fixed to the outer surface of the shaft 110, and the other end portion of the electrical wire band 134 is fixed in the vicinity of the accommodation port 121 of the chassis 120. Therefore, a wound state of the electrical wire band 134 changes when the shaft 110 rotates. In FIG. 2, the winding of the electrical wire band 134 is loosened when the shaft 110 rotates clockwise, and the winding of the electrical wire band 134 is tightened when the shaft 110 rotates counterclockwise.

Description of Advantageous Effects of Embodiment 1

It is possible to obtain the cable wrap mechanism 100 in which the cable 130 is wound and accommodated in the spiral spring shape with the low resistance force against bending and a low electromagnetic induction noise.

The electrical wire band 134 of the cable 130 is flattened by arranging the parallel wires 133 in the band shape without using a twisted wire or a shielded wire. Therefore, resistance force against bending in the electrical wire band 134 is minimized. Accordingly, the electrical wire band 134 can be easily wound into the spiral spring shape.

In contrast, if a twisted wire or a shielded wire is used to form the electrical wire band, the thickness of the electrical wire band is increased and the resistance force against bending becomes large. Therefore, such an electrical wire band is difficult to be bent. Accordingly, it is desirable to use the parallel wires 133 to form the electrical wire band 134.

The electrical wire band 134 has a length that allows routing the electrical wire band 134 around the shaft 110 for a plurality of times. Therefore, the resistance force against bending in the electrical wire band 134 is further reduced. This is because the longer the length of the electrical wire band 134 is, the smaller the resistance force against bending of the electrical wire band 134 is.

When a large current flows through an electrical wire, an electromagnetic induction noise is generated from the electrical wire. In this case, the electromagnetic induction noise needs to be minimized.

Typically, the electromagnetic induction noise is minimized by using a twisted wire. However, as described above, the electrical wire formed by using the twisted wire is difficult to be bent because the resistance force against bending is large. Since the hot wires (the first electrical wires 131) and the return wires (the second electrical wire 132) are arranged alternately in the electrical wire band 134 of the cable 130, the electromagnetic induction noise can be minimized. This is because the shorter the distance between the hot wire and the return wire is, the smaller the magnetic field is.

Since the electrical wire bundles (135 and 136) of the cable 130 are not wound and accommodated in a spiral spring shape, resistance force against bending in the electrical wire bundles does not need to be minimized.

Other Structures

The cable 130 may include an electrical wire that is different in type from the first electrical wire 131 and the second electrical wire 132. That is, the electrical wire band 134 is formed by arranging the first electrical wire 131, the second electrical wire 132 and the third electrical wire without being twisted together.

Embodiment 2

With regard to an embodiment in which the electromagnetic induction noise is further reduced, differences from the embodiment 1 will mainly be described with reference to FIG. 3.

Description of Structure

As illustrated in FIG. 3, a first electrical wire 131 is in close contact with an adjacent second electrical wire 132 in the electrical wire band 134.

Further, a surface and a back surface of the electrical wire band 134 are covered with an adhesive film 137 in a state where the first electrical wire 131 is in close contact with the adjacent second electrical wire 132. In FIG. 3, the entire electrical wire band 134 is covered with the adhesive film 137.

The adhesive film 137 is a film having adhesiveness. For example, the adhesive film 137 is a polyimide tape in which a pressure sensitive adhesive or an adhesive agent is adhered to a polyimide film.

The adhesive film 137 is stuck to the electrical wire band 134 in a state where the first electrical wire 131 is in close contact with the adjacent second electrical wire 132. Accordingly, the state where the first electrical wire 131 and the adjacent second electrical wire 132 are in close contact with each other is maintained.

In addition, by using the polyimide film, when the shaft 110 swings relative to the chassis 120, the frictional force due to movement of the electrical wire band 134 between the shaft 110 and the chassis 120 can be reduced.

Description of Advantageous Effects of Embodiment 2

Since the electrical wire band 134 is covered with the adhesive film 137, the state where the hot wire (the first electrical wire 131) and the adjacent return wire (the second electrical wire 132) are in close contact with each other can be maintained. The state where the hot wire and the return wire are in close contact with each other can be maintained even after experiencing, for example, the environment where vibration occurs during the launch of a rocket carrying the artificial satellite that uses the cable wrap mechanism 100.

In addition, the shorter the distance between the hot wire and the return wire is, the smaller the magnetic field is.

Therefore, the electromagnetic induction noise generated from the electrical wire band 134 can be further reduced.

Supplement to Embodiments

The embodiments are examples of preferred modes and are not intended to limit the scope of the present invention. The embodiments may be implemented partially or in combination with other modes.

REFERENCE SIGNS LIST

100: cable wrap mechanism; 110: shaft; 120: chassis; 121: accommodation port; 130: cable; 131: first electrical wire; 132: second electrical wire; 133: parallel electrical wire; 134: electrical wire band; 135, 136: electrical wire bundle; 137: adhesive film; 140: movable portion.

The invention claimed is:

1. A cable wrap mechanism in which a part of a cable is wound and accommodated in a spiral spring shape, the cable wrap mechanism comprising:
   a chassis in which the cable is wound and accommodated in a spiral spring shape: and
   a shaft provided within the chassis, one end portion of the cable in a length direction is fixed to the shaft within the chassis: and
   wherein the cable includes an electrical wire band.
   wherein the electrical wire band includes a plurality of parallel electrical wires in which a first electrical wire which is a hot wire and a second electrical wire which is a return wire and forms a pair with the first electrical wire are arranged adjacently without being twisted together,
   wherein the plurality of parallel electrical wires are arranged in a lateral row, and a second electrical wire of one parallel electrical wire of adjacent parallel electrical wires and a first electrical wire of the other parallel electrical wire of the adjacent parallel electrical wires are arranged to be adjacent to each other, and
   wherein the electrical wire band is wound and accommodated in a spiral spring shape as a part of the cable.

2. The cable wrap mechanism according to claim 1, wherein the first electrical wire is in close contact with the adjacent second electrical wire in the electrical wire band.

3. The cable wrap mechanism according to claim 2, wherein a surface and a back surface of the electrical wire band are covered with an adhesive film.

4. The cable wrap mechanism according to claim 1, wherein the cable is used as a wiring of a thruster mounted on an artificial satellite.

5. Previously Presented) The cable wrap mechanism according to claim 2,
   wherein the cable is used as a wiring of a thruster mounted on an artificial satellite.
6. The cable wrap mechanism according to claim 3,
   wherein the cable is used as a wiring of a thruster mounted on an artificial satellite.
7. A cable wrap mechanism, comprising:
   a cable in which a part of the cable is wound and accommodated in a spiral spring shape, the cable configured to be used as wiring of a rotating thruster mounted on an artificial satellite, wherein the cable includes an electrical wire band;
   a movable portion of a thruster pointing mechanism of the rotating thruster, the thruster pointing mechanism is configured to adjust an arrangement of the rotating thruster;
   a shaft comprising an outer surface to which one end portion of the electrical wire band in a length direction is fixed; and
   a chassis in which the shaft is provided and the electrical wire band is wound and accommodated in the spiral spring shape,
   wherein the electrical wire band includes a plurality of parallel electrical wires in which a first electrical wire which is a hot wire and a second electrical wire which is a return wire and forms a pair with the first electrical wire, are arranged adjacently without being twisted together,
   wherein the plurality of parallel electrical wires are arranged in a lateral row, and a second electrical wire of one parallel electrical wire of adjacent parallel electrical wires and a first electrical wire of the other parallel electrical wire of the adjacent parallel electrical wires are arranged to be adjacent to each other,
   wherein the electrical wire band is wound and accommodated in a spiral spring shape as a part of the cable,
   wherein the shaft is rotatable relative to the chassis, and the wound state of the electrical wire band changes when the shaft rotates, and
   wherein the shaft is connected to the movable portion of the rotating thruster, and the shaft rotates together with the movable portion.

* * * * *